(12) United States Patent
Fujikawa et al.

(10) Patent No.: US 11,008,670 B2
(45) Date of Patent: May 18, 2021

(54) MANUFACTURING METHOD OF SIC INGOT

(71) Applicant: SHOWA DENKO K.K., Tokyo (JP)

(72) Inventors: Yohei Fujikawa, Hikone (JP); Hideyuki Uehigashi, Kariya (JP)

(73) Assignee: SHOWA DENKO K.K., Tokyo (JP)

( * ) Notice: Subject to any disclaimer, the term of this patent is extended or adjusted under 35 U.S.C. 154(b) by 44 days.

(21) Appl. No.: 16/466,369

(22) PCT Filed: Dec. 22, 2017

(86) PCT No.: PCT/JP2017/046134
§ 371 (c)(1),
(2) Date: Jun. 4, 2019

(87) PCT Pub. No.: WO2018/123868
PCT Pub. Date: Jul. 5, 2018

(65) Prior Publication Data
US 2020/0087815 A1    Mar. 19, 2020

(30) Foreign Application Priority Data

Dec. 26, 2016   (JP) ............................. JP2016-251169

(51) Int. Cl.
*C30B 23/02* (2006.01)
*C30B 23/06* (2006.01)
(Continued)

(52) U.S. Cl.
CPC .............. *C30B 23/06* (2013.01); *C30B 29/36* (2013.01); *C30B 33/10* (2013.01)

(58) Field of Classification Search
CPC ........ C30B 23/02; C30B 23/04; C30B 23/025
See application file for complete search history.

(56) References Cited

U.S. PATENT DOCUMENTS

| 2007/0281173 A1* | 12/2007 | Kojima | H01L 29/045 428/446 |
| 2011/0204383 A1* | 8/2011 | Yamamoto | H01L 29/6606 257/77 |
| 2013/0087808 A1* | 4/2013 | Konstantinov | H01L 29/06 |

FOREIGN PATENT DOCUMENTS

| CN | 101027433 A | 8/2007 |
| CN | 105408531 A | 3/2016 |

(Continued)

OTHER PUBLICATIONS

International Search Report of PCT/JP2017/046134 dated Mar. 20, 2018 [PCT/ISA/210].

(Continued)

*Primary Examiner* — Robert M Kunemund
(74) *Attorney, Agent, or Firm* — Sughrue Mion, PLLC

(57) ABSTRACT

A manufacturing method of a SiC ingot includes a crystal growth step of growing a crystal on a principal plane having an offset angle with respect to a {0001} plane, in which, at least in a latter half growth step of the crystal growth step, after the crystal in the crystal growth step grows 7 mm or more from the principal plane, and in which, the crystal is grown by setting an acute angle, between the {0001} plane and an inclined plane which is perpendicular to a cut section cut along an offset direction and passes through both a center of a crystal growth surface and an offset downstream end portion of the crystal growth surface, to be equal to or more than an angle smaller than an offset angle by 2° and equal to or less than 8.6°.

8 Claims, 3 Drawing Sheets

FIG. 3

(51) Int. Cl.
    *C30B 29/36* (2006.01)
    *C30B 33/10* (2006.01)

(56) References Cited

FOREIGN PATENT DOCUMENTS

| | | |
|---|---|---|
| JP | 2003-095794 A | 4/2003 |
| JP | 2006-225232 A | 8/2006 |
| JP | 2011-219294 A | 11/2011 |
| JP | 2012-046377 A | 3/2012 |
| JP | 2014-040357 A | 3/2014 |
| JP | 2014-101246 A | 6/2014 |
| JP | 2015-059072 A | 3/2015 |
| WO | 2016/006442 A1 | 1/2016 |

OTHER PUBLICATIONS

Office Action dated Aug. 28, 2020 from the China National Intellectual Property Administration in Application No. 201780078707.6.

\* cited by examiner

MANUFACTURING METHOD OF SIC INGOT

CROSS REFERENCE TO RELATED APPLICATIONS

This application is a National Stage of International Application No. PCT/JP2017/046134, filed Dec. 22, 2017, claiming priority from Japanese Patent Application No. 2016-251169, filed Dec. 26, 2016, the contents of all of which are incorporated herein by reference in their entirety.

TECHNICAL FIELD

The present invention relates to a manufacturing method of a SiC ingot.

BACKGROUND ART

Silicon carbide (SiC) has a dielectric breakdown field larger by one order of magnitude and a band gap three times larger than those of silicon (Si). In addition, silicon carbide (SiC) has characteristics such that the thermal conductivity is approximately three times higher than that of silicon (Si). Application of silicon carbide (SiC) to power devices, high-frequency devices, high-temperature operation devices, and the like is expected.

In a device such as a semiconductor, a SiC epitaxial wafer having an epitaxial film formed on a SiC wafer is used. The epitaxial film provided on the SiC wafer by a chemical vapor deposition (CVD) method becomes an active region of the SiC semiconductor device.

For this reason, high-quality SiC wafers with no breaking such as cracking and few defects are required. In this specification, the SiC epitaxial wafer means a wafer after forming the epitaxial film, and the SiC wafer means a wafer before forming the epitaxial film.

For example, Patent Document 1 describes that breaking of a SiC wafer, incorporation of polycrystalline and polymorphic forms, and generation of micropipe defects are reduced by crystal growth performed so that (H/D)≥0.1 is satisfied when it is assumed that the major axis of the bottom plane of a grown SiC single crystal is D and the length of a perpendicular line connecting the bottom plane to the apex of the grown SiC single crystal is H.

In addition, Patent Document 2 describes that cracking and strain of a SiC ingot can be reduced by performing concave growth in which a center portion is recessed more than an outer edge portion after convex growth in which the center portion protrudes more than the outer edge portion. Since a SiC wafer is obtained by slicing a SiC ingot, the SiC ingot is a pre-stage of the SiC wafer.

CITATION LIST

Patent Literature

[Patent Document 1] Japanese Unexamined Patent Application, First Publication No. 2003-095794
[Patent Document 2] Japanese Unexamined Patent Application, First Publication No. 2011-219294

SUMMARY OF INVENTION

Technical Problem

As one of killer defects of a SiC wafer, there is a basal plane dislocation (BPD). The basal plane dislocation is a defect generated along a {0001} plane. In a SiC wafer having an offset angle, there are cases where a large number of BPDs are arranged in rows.

There are various factors in the generation of basal plane dislocations, but a set of basal plane dislocations present in rows is considered to be one of causes of slip that occurs in a basal plane when strain generated in a SiC ingot growth process is relieved. Such basal plane dislocation groups present in rows are hereinafter referred to as "slip bands". A SiC wafer in which slip bands are generated has a factor causing device failure and thus cannot be used in a subsequent step.

However, even when methods described in Patent Documents 1 and 2 in which a SiC single crystal is grown while reducing the generation of stress are used, the generation of basal plane dislocation cannot be sufficiently reduced.

The present invention has been made taking the foregoing problems into consideration, and an object thereof is to provide a manufacturing method of a SiC ingot capable of restraining the generation of slip bands and furthermore reducing the generation of basal plane dislocations.

Solution to Problem

As a result of intensive investigations, the present inventors found that by performing a crystal growth process under predetermined conditions, a manufacturing method of a SiC ingot capable of restraining the generation of slip bands and furthermore reducing the generation of basal plane dislocations can be obtained.

That is, the present invention provides the following processes in order to solve the above problems.

(1) According to an aspect, a manufacturing method of a SiC ingot includes a crystal growth step of growing a crystal on a principal plane having an offset angle with respect to a {0001} plane, in which, at least in a latter half growth step of the crystal growth step, after the crystal in the crystal growth step grows 7 mm or more from the principal plane, and in which, the crystal is grown by setting an acute angle, between the {0001} plane and an inclined plane which is perpendicular to a cut section cut along an offset direction and passes through both a center of a crystal growth surface and an offset downstream end portion of the crystal growth surface, to be equal to or more than an angle smaller than an offset angle by 2° and equal to or less than 8.6°. The offset angle is larger than 0°.

(2) In the manufacturing method of a SiC ingot according to the aspect, in all crystal growth processes of the crystal growth step, the acute angle may be set to be equal to or more than the angle smaller than the offset angle by 2° and equal to or less than 8.6°.

(3) In the manufacturing method of a SiC ingot according to the aspect, the offset angle may be 4° or less.

(4) In the manufacturing method of a SiC ingot according to the aspect, in the latter half growth step of the crystal growth step, an angle change in the acute angle may be set to 3° or less.

(5) In the manufacturing method of a SiC ingot according to the aspect, in the latter half growth step of the crystal growth step, crystal growth on an offset downstream side and crystal growth on an offset upstream side may be symmetrical to each other with respect to a plane that passes through the center of the crystal growth surface and is orthogonal to the cut section.

Advantageous Effects of Invention

According to the manufacturing method of a SiC ingot according to the aspect of the present invention, it is possible to manufacture a SiC wafer with a low degree of BPDs by restraining the generation of slip bands.

DESCRIPTION OF EMBODIMENTS

Figure 1:
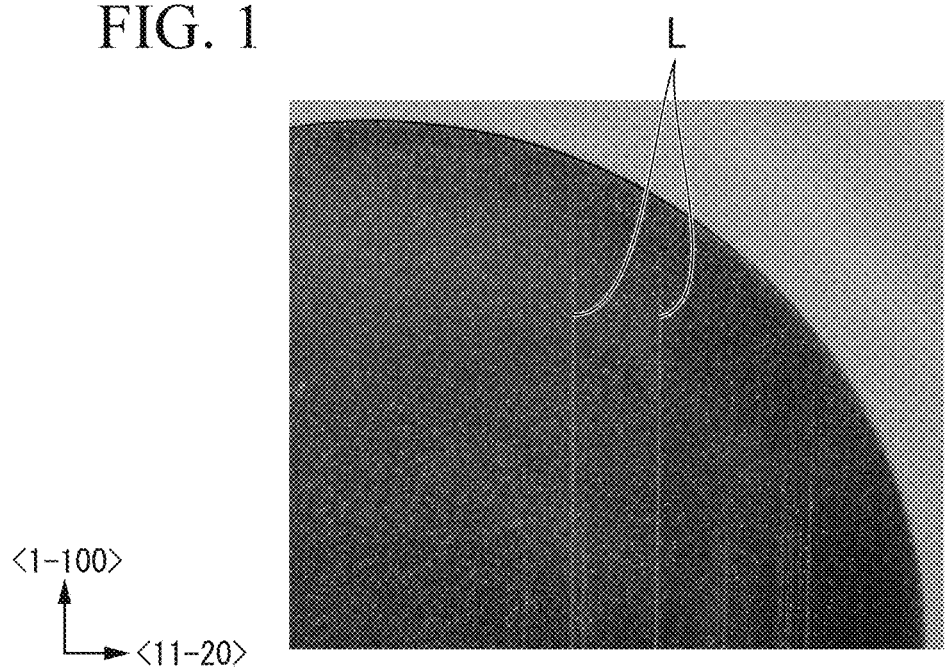
FIG. 1 is a plan view of a portion of a SiC wafer etched with KOH.

Hereinafter, an embodiment will be described in detail with reference to the drawings as appropriate. In the drawings used in the following description, there are cases where characteristic portions are enlarged for convenience, and the dimensional ratio and the like of each constituent element may be different from reality. The materials, dimensions, and the like shown in the following description are merely examples, and the present invention is not limited thereto and can be embodied in appropriately modified manners in a range that does not change the gist thereof.

"Slip Band"

Figure 2:
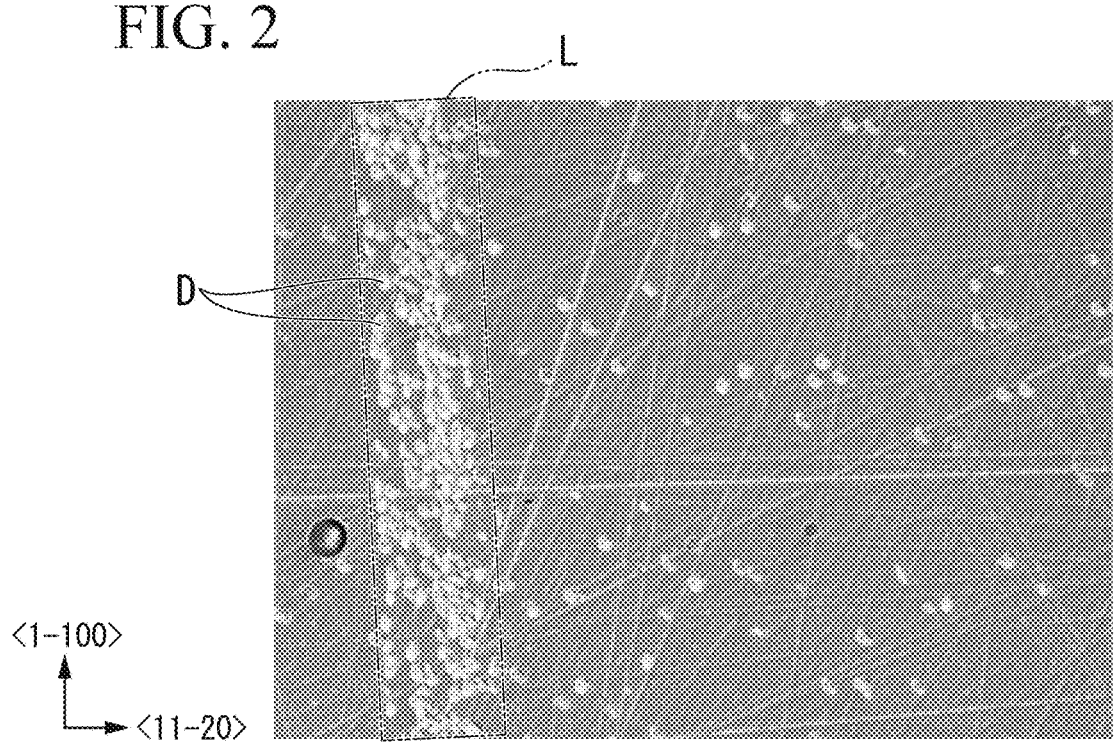
FIG. 2 is an enlarged view of the vicinity of a slip band in FIG. 1.

First, a slip band will be described. FIGS. 1 and 2 show a Si surface of a SiC wafer after being etched with KOH. FIG. 1 is a plan view of a portion of the SiC wafer on an offset downstream side (a side of opposite to an offset upstream side or a side of an initial facet formation in an offset growth). As the image of the SiC wafer, a photograph is used in FIG. 1, and an optical micrograph is used in FIG. 2. The SiC wafer in FIG. 1 is offset in a <11-20> direction. In FIG. 1, the left side is the offset upstream side (a side of growing a facet in the offset growth), and the right side is the offset downstream side. As shown in FIG. 1, slip bands L are sets of basal plane dislocations seen in lines extending along a direction macroscopically intersecting an offset direction when the SiC wafer is viewed in a plan view. No slip band is observed on the offset upstream side of the SiC wafer. The slip bands L are likely to be generated on the offset downstream side of the SiC wafer.

In this specification, the "offset upstream" refers to a direction in which the tip of a vector projected on the principal plane of a single crystal (seed crystal) is directed while projecting a normal vector of a {0001} plane on the principal plane of a single crystal, and the "offset downstream" refers to a direction opposite to the offset upstream. In addition, the "offset direction" refers to a direction parallel to the vector projected on the principal plane of the single crystal (seed crystal) while projecting a normal vector of a {0001} plane on the principal plane of a single crystal. In FIG. 1, the offset downstream is the <11-20> direction, and the offset upstream is the opposite side.

FIG. 2 is an enlarged view of the vicinity of the slip bands L in FIG. 1. As shown in FIG. 2, the slip band L is seen as a line shape in which a plurality of fine defects D gather. The defects D are basal plane dislocations (BPDs) present along the {0001} plane. Since the basal plane dislocations are formed in pit shapes by KOH etching, the slip band is seen as a form in which a dense portion of etch pits extends linearly. As described above, since the slip band has a form in which the basal plane dislocations gather densely in a line shape, the slip band can be determined by its shape and can be distinguished from isolated basal plane dislocations.

As shown in FIGS. 1 and 2, the slip bands L occur in a wide range of the SiC wafer. Therefore, the slip bands L are killer defects in the SiC wafer.

"Manufacturing Method of SiC Ingot"

A manufacturing method of a SiC ingot according to this embodiment will be described. When the manufacturing method of a SiC ingot according to this embodiment is used, it is possible to manufacture a SiC wafer with a low degree of BPDs by restraining and reducing the generation of the slip bands L described above.

The manufacturing method of a SiC ingot according to this embodiment has a crystal growth step of growing a crystal on a principal plane having an offset angle with respect to a {0001} plane.

As one of manufacturing methods of a SiC ingot, a sublimation method is known. The sublimation method is a method of recrystallizing a source gas generated by heating a source powder on a single crystal (seed crystal) to obtain a large single crystal.

Figure 3:
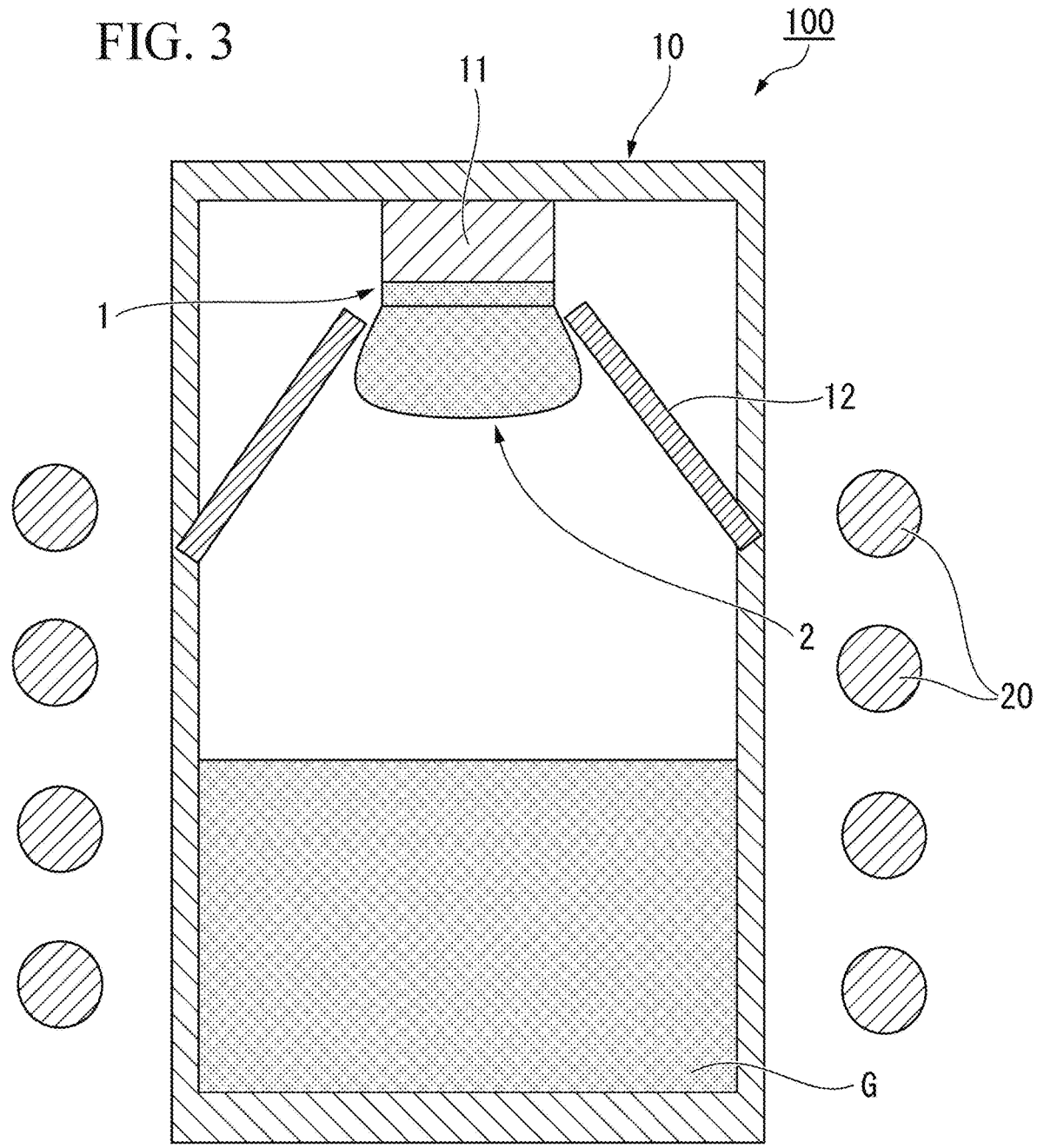
FIG. 3 is a schematic view of an example of a manufacturing apparatus used for a sublimation method.

FIG. 3 is a schematic view of an example of a manufacturing apparatus used for the sublimation method. A manufacturing apparatus 100 has a crucible 10 and a coil 20. A heating element (not shown) that generates heat by induction heating of the coil 20 may be provided between the crucible 10 and the coil 20.

The crucible 10 has a crystal installation portion 11 provided at a position facing a source G. The crucible 10 may have a tapered guide 12 therein, which increases in diameter from the crystal installation portion 11 toward the source G For ease of understanding, FIG. 3 simultaneously show the source G, a seed crystal 1, and a SiC ingot 2 grown from the seed crystal.

When an alternating current is applied to the coil 20, the crucible 10 is heated, and a source gas is generated from the source G The generated source gas is supplied to the seed crystal 1 installed on the crystal installation portion 11 along the tapered guide 12. By supplying the source gas to the seed crystal 1, the SiC ingot 2 is grown on the principal plane of the seed crystal 1.

Therefore, in the manufacturing method of a SiC ingot according to this embodiment, the principal plane of the seed crystal 1 is set to a surface having an offset angle with respect to the {0001} plane, and the principal plane is installed on the crystal installation portion 11 to face the source G. Here, the "offset angle" is an angle between the normal vector of the principal plane and the normal vector of the {0001} plane.

On the principal plane having an offset angle, a SiC single crystal undergoes step-flow growth. In the step-flow growth, a crystal grows in a c-plane direction as a whole while growing in an a-plane direction.

Therefore, by using the step-flow growth, defects and dislocations generated on the offset upstream side can be caused to flow out to the offset downstream side. That is, defects and crystal dislocations generated in the crystal growth process can be caused to flow out to the outside, thereby obtaining a high-quality SiC ingot.

The offset angle is larger than 0°. Since the offset angle is larger than 0°, the offset downstream side can be defined. Furthermore, the offset angle of the principal plane with respect to the {0001} plane is preferably 2° or more and 8° or less, and more preferably 2° or more and 4° or less.

As the offset angle of the principal plane with respect to the {0001} plane decreases, slip bands L are less likely to be generated. It is considered that this is because, when the offset angle is too large, stress is applied in a c-plane slip direction (a direction parallel to the {0001} plane) due to a temperature gradient, and basal plane dislocations are likely to be generated.

In addition, as the difference from an offset angle (typically 4° or less) of a SiC wafer used for manufacturing a device or the like increases, it is necessary to obliquely cut the SiC wafer from the SiC ingot. That is, the number of SiC wafers to be obtained is reduced.

As described above, the seed crystal 1 is installed in the crucible 10, and the SiC ingot 2 is grown. Next, conditions for the crystal growth process will be described.

Figure 4:
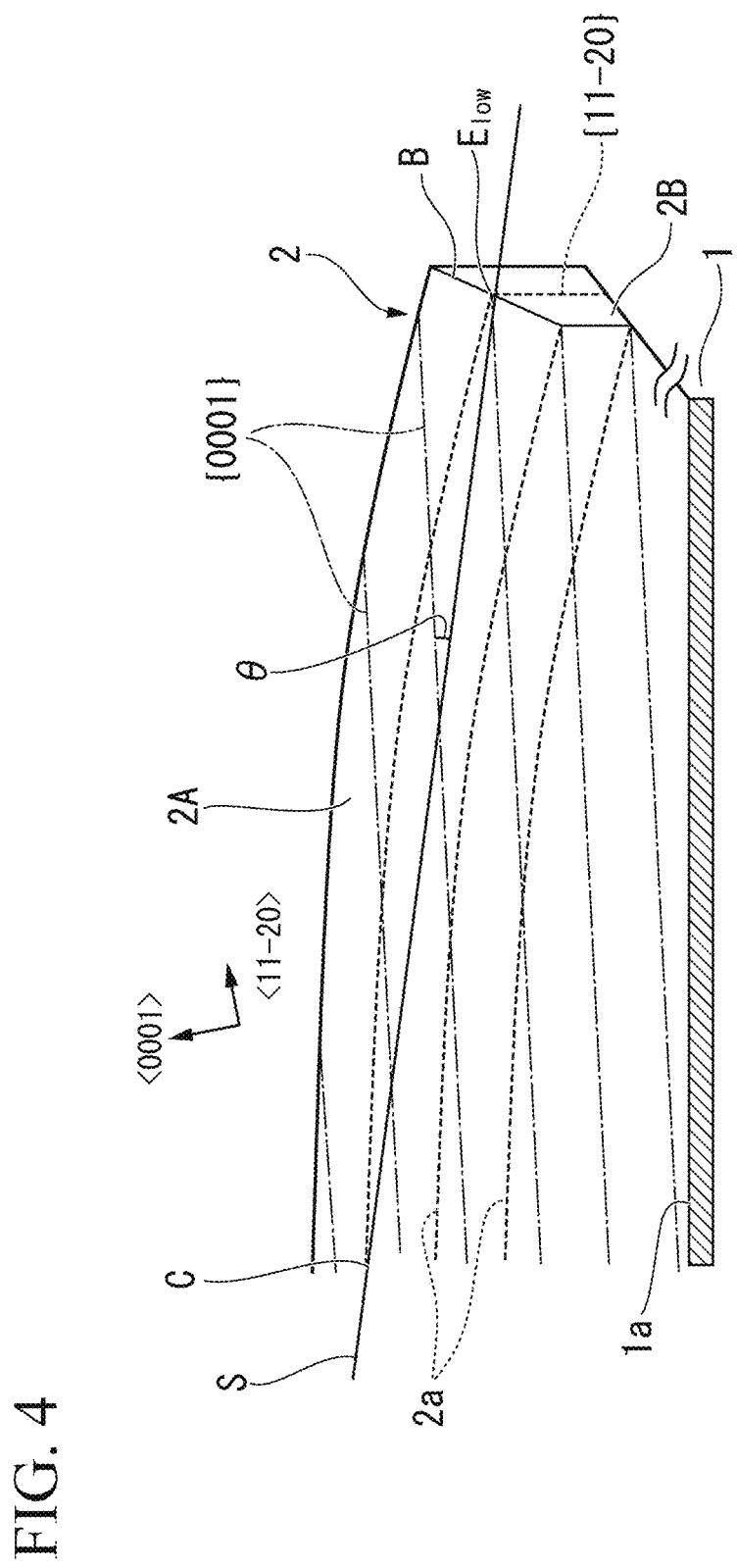
FIG. 4 is a view showing a form of crystal growth process on an offset downstream side of a SiC ingot.

FIG. 4 is a view showing a form of the crystal growth process on the offset downstream side of the SiC ingot. The plane shown in FIG. 4 is a cross section including the center of a crystal growth surface at a cut section cut along the offset direction. As shown in FIG. 4, the SiC ingot 2 has a c-plane growth region 2A and a side plane growth region 2B.

The c-plane growth region 2A is a region in which crystal growth occurs in a <0001> direction perpendicular to the {0001} plane. Contrary to this, the side plane growth region 2B is a region in which the source gas is supplied from the side plane of the SiC ingot in the growth process and crystal growth occurs in a direction different from the <0001> direction. Since the c-plane growth region 2A and the side plane growth region 2B are different from each other in crystal growth direction, there is a boundary B between the c-plane growth region 2A and the side plane growth region 2B.

In the side plane growth region 2B, crystal growth occurs as the source gas flows around the side plane of the SiC ingot. That is, it is difficult to control the crystal growth process. Contrary to this, the c-plane growth region 2A grows along isotherms generated in the crucible 10 and thus can be controlled. That is, in the manufacturing method of a SiC ingot according to this embodiment, the growth state of the c-plane growth region 2A is controlled.

In a growth method of a SiC ingot according to this embodiment, crystal growth is performed so that an acute angle θ between a predetermined inclined plane S and the {0001} plane is equal to or more than an angle smaller than the offset angle by 2° and equal to or less than 8.6°. The predetermined inclined plane S is a plane which is perpendicular to the cut section cut along the offset direction and connects a center C of a crystal growth surface 2a to an offset downstream end portion $E_{LOW}$. In addition, an angle smaller than the offset angle by 2° means a numerical value obtained by subtracting 2° from the absolute value of the numerical value of the offset angle.

Here, the "crystal growth surface 2a" means the outer surface of the c-plane growth region 2A exposed during the crystal growth process. In addition, the "center C of the crystal growth surface" means the center of the SiC ingot in a plan view during the crystal growth process. This point passes through the center when the principal plane 1a of the seed crystal 1 is viewed in a plan view and corresponds to the intersection between a line perpendicular to a principal plane 1a and the crystal growth surface 2a.

The "offset downstream end portion $E_{LOW}$" is an end portion of the crystal growth surface 2a closest to the offset downstream side and is a point where the cut section along the offset direction and the crystal growth surface 2a intersect. That is, in a case where the side plane growth region 2B is present, the "offset downstream end portion $E_{LOW}$" is a point where the cut section taken along the offset direction and the boundary B between the c-plane growth region 2A and the side plane growth region 2B intersect.

When crystal growth is performed so that the acute angle θ between the predetermined inclined plane S and the {0001} plane is equal to or more than an angle smaller than the offset angle by 2° and equal to or less than 8.6°, the generation of the slip bands L is reduced.

In order to reduce the generation of the slip bands L, it is particularly important to set the upper limit of the acute angle θ to 8.6° or less. The lower limit thereof is determined to be the corresponding value because it is not preferable that the shape of the crystal growth surface 2a is greatly concave. However, since it is acceptable for a portion of the growth surface to have a slightly concave shape, the lower limit is preferably the angle obtained by subtracting 2° from the offset angle. Furthermore, it is more preferable that the shape of the growth surface is finely convex as a whole. Therefore, the lower limit is more preferably equal to or more than a value obtained by subtracting 1° from the offset angle, and even more preferably equal to or more than the offset angle.

The cause of the reduction of the generation of the slip bands L is not clear. However, it is considered that the shape of the crystal growth surface 2a of the SiC ingot 2 contributes to the reduction of the generation of the slip bands L.

As the acute angle between the predetermined inclined plane S and the {0001} plane increases, the shape of the SiC ingot becomes convex. The SiC ingot 2 grows at a high temperature exceeding 2000° C. Therefore, there are cases where a temperature change occurs in the SiC ingot 2 during cooling for extraction from the crucible or in the growth process. When the thickness of the SiC ingot varies in places, stress is generated in the SiC ingot 2 due to a temperature difference caused by the difference in heat capacity.

When stress generated in the SiC ingot 2 is relieved, a crystal may slip along the {0001} plane. One of causes of basal plane dislocations is slip in the {0001} plane, and an aggregate of the basal plane dislocations is the slip band L. That is, it is considered that the generation of the slip bands L is reduced by performing crystal growth so that no stress is generated in the SiC ingot 2.

On the other hand, considering only the reliving of the stress (the shape of the crystal growth surface 2a), it is considered that the slip bands L may be generated symmetrically on the offset upstream side and the downstream side with respect to the center C of the crystal growth surface. However, the slip bands L have characteristics such that the slip bands L are likely to be generated on the offset downstream side.

The fact that places where the slip bands L are generated have anisotropy cannot be explained from only the convexity of the crystal growth surface 2a. Although this point is not sufficiently explained, it is considered that the relationship between the direction in which stress is applied and the {0001} plane has an effect.

The temperature difference during the growth is greatest in the direction normal to the crystal growth surface 2a and becomes a cause the generation of stress. It is considered that when the direction in which this type of stress is applied and the {0001} plane are close to parallel to each other, the crystal slips along the {0001} plane and the slip bands L are likely to be generated. When the offset upstream side and the offset downstream side are compared to each other, the direction in which the stress is applied and the {0001} plane more easily become close to parallel to each other on the offset downstream side.

From this viewpoint, it is considered that the acute angle θ between the predetermined inclined plane S defined by the crystal growth surface 2a and the {0001} plane contributes to the presence or absence of the generation of the slip bands L. Although details will be described later in examples described later, it is confirmed that when the acute angle θ between the predetermined inclined plane S and the {0001} plane is equal to or more than an angle smaller than the offset angle by 2° and equal to or less than 8.6°, the generation of the slip bands L is significantly restrained and reduced.

The acute angle θ between the predetermined inclined plane S and the {0001} plane may satisfy a predetermined relationship relating to the acute angle θ at least in a latter half growth process of the crystal growth step after the crystal has grown 7 mm or more from the principal plane 1a. Here, the crystal growth amount is obtained as the thickness in the center C of the crystal growth surface.

The stress generated in the SiC ingot increases as the thickness of the SiC ingot increases. Therefore, in a region where the thickness of the SiC ingot is sufficiently thin, the slip bands L are less likely to be generated even when the predetermined relationship relating to the acute angle θ is not satisfied.

On the other hand, when the predetermined relationship relating to the acute angle θ is satisfied even in an initial stage of the crystal growth step, stress is less likely to be generated in the SiC ingot, and the generation of the slip bands L is restrained and reduced. That is, in all the crystal growth processes of the crystal growth step, it is preferable to set the acute angle θ between the predetermined inclined plane S and the plane to be equal to or more than an angle smaller than the offset angle by 2° and equal to or less than 8.6°.

In addition, in the crystal growth process, it is preferable that the shape of the crystal growth surface 2a is kept constant.

When the shape of the crystal growth surface 2a is constant, strain is less likely to be generated in the crystal growth process. That is, stress is less likely to be generated in the SiC ingot 2.

In order to cause the shape of the crystal growth surface 2a to be constant, in the crystal growth process of the crystal growth step, it is preferable to set the angle change amount of the acute angle θ between the predetermined inclined plane S and the {0001} plane to 3° or less. When the relationship relating to the angle change is satisfied, it can be said that the SiC ingot 2 grows in a similar shape in the growth process.

Hereinabove, the relationship between the crystal growth surface 2a and the {0001} plane at the offset downstream is defined. This is because the slip bands L are likely to be generated on the offset downstream side as described above.

On the other hand, from the viewpoint of relieving stress, it is preferable that the shapes of the SiC ingot 2 on the offset downstream side and the offset upstream side in the crystal growth process are symmetrical to each other. That is, it is preferable that crystal growth on the offset downstream side and crystal growth on the offset upstream side are symmetrical to each other with respect to a plane that passes through the center of the crystal growth surface and is orthogonal to the offset direction.

After being manufactured under the above-described conditions, growth of the SiC ingot is stopped. The manufacturing apparatus 100 is cooled to take out the SiC ingot 2 grown at a high temperature exceeding 2000° C. from the crucible 10. Cooling includes both natural cooling and forced cooling with external force.

Hereinabove, preferable conditions in the process of manufacturing the SiC ingot have been described.

Next, a method for satisfying such conditions will be described.

Crystal growth is greatly affected by the temperature during crystal growth. Therefore, the isotherms are set so that the acute angle θ between the predetermined inclined plane S defined by the crystal growth surface 2a and the {0001} plane satisfies the predetermined relationship.

As a method of controlling the temperature distribution during crystal growth with respect to the crystal growth surface, a method disclosed in Japanese Unexamined Patent Application, First Publication No. 2008-290885 can be used. Specifically, a sublimation method crystal growth apparatus having a configuration in which two upper and lower heaters including a heater facing a side plane of a place where a seed crystal is disposed and a heater facing a side plane of a place where a source is disposed are provided and a partition wall portion formed of a heat insulation member is provided between the upper and lower heaters can be used. The partition wall portion prevents transfer of heat from the lower heater toward the upper side of the crucible and thus the isotherms with respect to the surface of the seed crystal can be controlled.

During crystal growth by the sublimation method, when growth is performed while periodically changing a nitrogen (N) doping amount, the growth surface has a stripe pattern due to the difference in nitrogen (N) concentration. The growth surface is sliced in the longitudinal sectional direction, and the shape of the growth surface at each time can be obtained from the interface with color changes. In a case where the growth surface changes during the growth, the shape of the growth surface can be maintained through adjustment according to the following method.

Maintaining the isotherms during crystal growth can be realized by further combining other techniques. Specifically, a crucible is moved during growth so that a change in the growth surface shape obtained in advance in the above-described method is corrected, and a technique in which the isotherms and a growth surface height are caused to be coincident with each other is combined.

First, a partition wall portion formed of a heat insulation material is provided between a high-temperature region and a low-temperature region to achieve a temperature distribution in which a {0001} plane of a seed crystal and an inclined plane defined by the isotherms satisfy a predetermined relationship at the time of the start of growth. In addition, the growth surface height at each time is inferred from the results of growth under the same conditions confirmed in advance.

In addition, when the temperature gradient in the vicinity of the crystal during growth increases, stress in the crystal increases. As the temperature gradient in the vicinity of the crystal, there are a temperature gradient in the growth direction (growth axis direction) and a temperature gradient in the radial direction.

The temperature gradient in the radial direction can be reduced by causing the isotherms to be parallel to the surface of the seed crystal using an apparatus having a partition wall portion and upper and lower heaters as described above. The temperature gradient in the growth axis direction can be reduced by reducing the temperature difference between the seed crystal and the source.

When the temperature gradient is too small, growth becomes unstable, so that it is preferable that the temperature gradient is about 50 Kcm$^{-1}$. By controlling both the temperature gradient in the growth axis direction and the temperature gradient in the radial direction to small values in a range in which stable growth can be achieved, the generation of stress can be restrained.

While the preferred embodiments of the present invention have been described above in detail, the present invention is not limited to the specific embodiments, and various changes and modifications can be made without departing from the scope of the present invention described in the claims.

EXAMPLES

Examination Example 1

First, a seed crystal serving as a nucleus of crystal growth was prepared. As the seed crystal, one having a 4H polytype, an offset angle of 4°, and a diameter of 4 inches was used.

Next, a single crystal was installed in a crucible as shown in FIG. 3 to perform crystal growth. The crystal growth was performed by changing the amount of nitrogen to be doped at regular time intervals. The isotherms during the crystal growth were controlled at each time. The shape of the isotherms during the crystal growth were changed for each example. That is, the shape of a crystal growth surface was prepared to be changed for each example.

The prepared SiC ingot was cut at a cut section taken along a <11-20> direction while passing through the center of the crystal growth surface. The cut section was photographed and the shape of the crystal growth surface was checked. In the section, a stripe pattern caused by the difference in the concentration of doped nitrogen was confirmed. The interface of the stripe pattern corresponds to the crystal growth surface in the crystal growth process.

Therefore, regarding the SiC ingot of each of examples prepared, the convexity of the crystal growth surface with the amount of doped nitrogen changed at regular time intervals, and a transition of an acute angle θ between a predetermined plane S and the plane was measured. The convexity was obtained by (H/D) when it is assumed that the major axis of the bottom plane of a grown SiC single crystal is D and the length of a perpendicular line connecting the bottom plane to the apex of the SiC ingot is H. Here, the major axis D of the bottom plane of the SiC single crystal was measured from the stripe pattern of the image obtained by photographing the cut section as the diameter of a plane connecting the end portions of the crystal growth surface at regular time intervals. In addition, the length of the perpendicular line drawn from the apex of the crystal growth surface at regular time intervals toward the plane connecting the end portions of the crystal growth surface at regular time intervals is referred to as H. Regarding each of the SiC ingots prepared, the results of the maximum value and the minimum value thereof are shown in Table 1.

Here, the maximum value and the minimum value are the maximum value and the minimum value regarding the convexity and the acute angle θ when 20 to 26 crystal growth surfaces shown as stripe patterns in an image of a section obtained by cutting the SiC ingot of each of the examples are observed at regular time intervals.

In addition, measurement of the convexity and the acute angle θ was performed in a region where the crystal growth amount exceeded 7 mm. In an initial stage of crystal growth, the end portion of the seed crystal was sublimated and thus was not evaluated.

The crystal growth amount was obtained from the image obtained by photographing the cut section.

In addition, the prepared SiC ingot was cut in a direction parallel to the principal plane of the seed crystal, and the presence or absence of the generation of slip bands was checked. The cut section was polished, then etched with KOH, and evaluated by whether or not a set of BPD pit rows was confirmed. The presence or absence of slip bands is shown in Table 1.

TABLE 1

|  | Convexity (mm) | | Acute angle θ (°) | | |
| --- | --- | --- | --- | --- | --- |
|  | max | min | max | min | Slip band |
| Example 1 | 4.4 | 1.8 | 8.2 | 5.7 | Absent |
| Example 2 | 2.7 | 2.1 | 6.5 | 6.0 | Absent |
| Example 3 | 3.2 | 2.3 | 7.1 | 6.2 | Absent |
| Example 4 | 4.4 | 3.3 | 8.2 | 7.1 | Absent |
| Example 5 | 4.8 | 2.0 | 8.6 | 5.9 | Absent |
| Example 6 | 3.5 | 2.4 | 7.3 | 6.3 | Absent |
| Comparative Example 1 | 5.8 | 3.1 | 9.5 | 6.9 | Present |
| Comparative Example 2 | 5.8 | 4.7 | 9.5 | 8.5 | Present |
| Comparative Example 3 | 5.3 | 3.7 | 9.0 | 7.5 | Present |
| Comparative Example 4 | 5.4 | 4.2 | 9.2 | 8.0 | Present |
| Comparative Example 5 | 5.8 | 5.0 | 9.5 | 8.7 | Present |
| Comparative Example 6 | 4.9 | 4.0 | 8.7 | 7.8 | Present |

As shown in Examples 1 to 6, the generation of slip bands could be restrained and reduced d by setting the acute angle θ to 8.6° or less.

Examination Example 2

Next, the same examination as in Examination Example 1 was conducted by changing the single crystal prepared initially.

In Examination Example 2, a single crystal having a 4H polytype, an offset angle of 4°, and a diameter of 6 inches, and a single crystal having a 4H polytype, an offset angle of 8°, and a diameter of 6 inches were prepared.

TABLE 2

|  | Convexity (mm) | | Acute angle θ (°) | | |
| --- | --- | --- | --- | --- | --- |
| Offset angle | max | min | max | min | Slip band |
| 4° | 3.8 | −0.3 | 7.6 | 3.7 | Absent |
| 8° | 3.8 | −0.5 | 11.6 | 7.5 | Present |

Even when the diameter of the single crystal was changed as described above, similar results were obtained. In addition, even when the offset angle was 8°, slip bands were generated when the acute angle θ exceeded 8.6°.

REFERENCE SIGNS LIST

1: seed crystal
1a: principal plane
2: SiC ingot
2a: crystal growth surface
2A: c-plane growth region
2B: side plane growth region
10: crucible
11: crystal installation portion
12: tapered guide
20: coil
100: manufacturing apparatus L: slip band
D: defect
B: boundary
C: center
$E_{LOW}$: offset downstream end portion
S: inclined plane
θ: acute angle

The invention claimed is:

1. A manufacturing method of a SiC ingot, comprising:
a step of setting a surface having an offset angle with respect to a {0001} plane in a seed crystal as a principal plane of the seed crystal;
a step of installing the seed crystal on a crystal installation portion, while the principal plane of the seed crystal faces a source; and
a step of growing a crystal on the principal plane of the seed crystal having an offset angle with respect to a {0001} plane,
wherein, the step of growing the crystal includes,
supplying a source gas to the seed crystal,
growing the crystal on the principal plane of the seed crystal,
after growing 7 mm or more of the crystal from the principal plane, growing the crystal by setting an acute angle, between the {0001} plane and an inclined plane which is perpendicular to a cut section cut along an offset direction and passes through both a center of a crystal growth surface and an offset downstream end portion of the crystal growth surface, to be equal to or more than an angle smaller than an offset angle by 2° and equal to or less than 8.6°.

2. The manufacturing method of a SiC ingot according to claim 1,
wherein, in all crystal growth processes of the step of growing the crystal, the acute angle is set to be equal to or more than the angle smaller than the offset angle by 2° and equal to or less than 8.6°.

3. The manufacturing method of a SiC ingot according to claim 1,
wherein the offset angle is larger than 0° and 4° or less.

4. The manufacturing method of a SiC ingot according to claim 1,
wherein, in the step of growing the crystal after growing 7 mm or more of the crystal from the principal plane, an angle change in the acute angle is set to 3° or less.

5. The manufacturing method of a SiC ingot according to claim 1,
wherein, in the step of growing the crystal after growing 7 mm or more of the crystal from the principal plane, crystal growth on an offset downstream side and crystal growth on an offset upstream side are symmetrical to each other with respect to a plane that passes through the center of the crystal growth surface and is orthogonal to the cut section.

6. The manufacturing method of a SiC ingot according to claim 1, the acute angle is controlled by a temperature distribution during growing the crystal.

7. The manufacturing method of a SiC ingot according to claim 6, the temperature distribution is controlled by two upper and lower heaters including a heater facing a side plane of a place where the seed crystal is disposed and a heater facing a side plane of a place where the source is disposed.

8. The manufacturing method of a SiC ingot according to claim 6, the temperature distribution is controlled by moving a crucible during growing of the crystal.

* * * * *